US012575374B2

(12) United States Patent　　　　　(10) Patent No.:　US 12,575,374 B2
Montmeat et al.　　　　　　　　　　(45) Date of Patent:　Mar. 10, 2026

(54) METHOD OF PREPARING A STRUCTURED SUBSTRATE FOR DIRECT BONDING

(71) Applicant: Commissariat à l'Énergie Atomique et aux Énergies Alternatives, Paris (FR)

(72) Inventors: Pierre Montmeat, Grenoble (FR); Franck Fournel, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 19/180,420

(22) Filed: Apr. 16, 2025

(65) Prior Publication Data

US 2025/0329567 A1　　Oct. 23, 2025

(30) Foreign Application Priority Data

Apr. 17, 2024　(FR) .................................. FR2403966

(51) Int. Cl.
　　*H01L 21/683*　　(2006.01)
　　*H01L 21/3065*　　(2006.01)
　　　　　　(Continued)

(52) U.S. Cl.
　　CPC ........ *H10P 72/7402* (2026.01); *H10P 50/242* (2026.01); *H10P 50/695* (2026.01);
　　　　　　(Continued)

(58) Field of Classification Search
　　None
　　See application file for complete search history.

(56) References Cited

U.S. PATENT DOCUMENTS

2008/0166525 A1* 7/2008 Swinnen ............. H01L 21/6835
　　　　　　　　　　　　　　216/41
2014/0295642 A1* 10/2014 Fournel ............. H01L 21/76259
　　　　　　　　　　　　　　257/629
(Continued)

FOREIGN PATENT DOCUMENTS

CN　　110178212 A　　8/2019
CN　　117878055 A　　4/2024
(Continued)

OTHER PUBLICATIONS

Search Report dated Feb. 18, 2025 in connection with French Application No. 2403966.
(Continued)

*Primary Examiner* — Erik T. K. Peterson
(74) *Attorney, Agent, or Firm* — Wolf, Greenfield & Sacks, P.C.

(57) ABSTRACT

A method of preparing a structured substrate of interest including the following steps: providing a substrate of interest including a thin film, onto which a protective layer has been bonded by direct bonding, depositing a resin, and etching the thin film and a portion of the support substrate through openings in the resin, to form pads, bonding a temporary substrate to the substrate of interest, then separating them, whereby the protective layer is separated from the substrate of interest, the resin being removed prior to the bonding step or during the separation, the protective layer/ thin film adhesion energy being lower than the temporary substrate/protective layer adhesion energy or than the resin/ protective layer adhesion energy.

10 Claims, 4 Drawing Sheets

(51) Int. Cl.

| | |
|---|---|
| *H01L 21/308* | (2006.01) |
| *H01L 21/78* | (2006.01) |
| *H10P 50/00* | (2026.01) |
| *H10P 50/24* | (2026.01) |
| *H10P 54/00* | (2026.01) |
| *H10P 72/70* | (2026.01) |

(52) U.S. Cl.

CPC .............. *H10P 54/00* (2026.01); *H10P 72/74* (2026.01); *H10P 72/7434* (2026.01); *H10P 72/744* (2026.01)

(56) References Cited

U.S. PATENT DOCUMENTS

| | | | |
|---|---|---|---|
| 2017/0011954 A1* | 1/2017 | Bedell ................. H01L 21/0276 |
| 2018/0182639 A1 | 6/2018 | Uzoh et al. |
| 2020/0388503 A1 | 12/2020 | Uzoh et al. |
| 2023/0008039 A1 | 1/2023 | Uzoh et al. |

FOREIGN PATENT DOCUMENTS

| | | |
|---|---|---|
| EP | 3563411 A2 | 11/2019 |
| KR | 20190092574 A | 8/2019 |
| TW | 201826335 A | 7/2018 |
| WO | WO 2018/125673 A2 | 7/2018 |

OTHER PUBLICATIONS

Dautriat et al., Polymer to Silicon Direct Bonding for Microelectronics. ECS Transactions. Sep. 2023;112(3):51-63. 13 pages.

Fournel et al., Measurement of bonding energy in an anhydrous nitrogen atmosphere and its application to silicon direct bonding technology. Journal of Applied Physics. May 2012;111(3):104907. 8 pages.

* cited by examiner

METHOD OF PREPARING A STRUCTURED SUBSTRATE FOR DIRECT BONDING

CROSS REFERENCE TO RELATED APPLICATIONS

This application claims priority to French application number FR2403966, filed Apr. 17, 2024. The contents of which is incorporated by reference in its entirety.

TECHNICAL FIELD

The present disclosure generally concerns the field of microelectronics, and more particularly a method of preparing a structured substrate that can be used for direct bonding.

PRIOR ART

In the field of microelectronics, the bonding of structured substrates is particularly advantageous. For example, a hybrid $Cu/SiO_2$ surface may be bonded to another structured hybrid $Cu/SiO_2$ surface exhibiting pads (or steps). The structuring is generally achieved by photolithography/etch steps.

More particularly, as shown in FIGS. 1A to 1E, such a structured substrate can be formed according to the following method:

- providing a substrate 10, having been previously polished, comprising a support substrate 11 covered with a hybrid $Cu/SiO_2$ layer 12 (FIG. 1A),
- depositing a resin layer 20 on substrate 10 (FIG. 1B),
- forming openings in resin layer 20 (FIG. 1C),
- etching hybrid layer 12 and a portion of support substrate 11 through the openings, thereby obtaining a structured substrate 10 (FIG. 1D),
- removing resin 20 (FIG. 1E).

Structured substrate 10 can then be bonded to another substrate 30 comprising a support substrate 31 and a hybrid $Cu/SiO_2$ layer 32 (FIG. 1F).

Methods of assembly by direct bonding require a meticulous preparation of the surfaces of the substrates which will be assembled. Their surface condition is crucial for the success of the bonding, and chemical and particulate contamination must be avoided.

It is thus important to be able to fully remove the resin.

Plasma cleaning methods combined with wet cleanings can be implemented to remove all contamination.

However, these cleaning methods are relatively aggressive, which may degrade the quality of the surface to be bonded (especially its roughness). This is particularly true for surfaces comprising copper, typically hybrid $Cu/SiO_2$ surfaces.

The cleaning of the resin may thus deteriorate the hybrid surface which has been previously polished by chemical-mechanical polishing.

The bonding of the two substrates is then of poor quality.

Further, it is impossible to polish the surface again, since the structuring results in that the polishing process would round off the edges of the pads and would prevent the bonding in these areas.

SUMMARY OF THE INVENTION

There exists a need to have a method of preparing a structured substrate of interest capable of being subsequently used for a direct bonding, the method having to enable to obtain substrate surfaces of good quality. This need is particularly important for substrates having hybrid $Cu/SiO_2$ surfaces.

This aim is achieved by a method of preparing a structured substrate of interest for direct bonding comprising the following steps:

- a) providing a substrate of interest comprising a support substrate and a thin film,
- b) bonding a protective layer to the thin film by direct bonding,
- c) depositing a resin on the protective layer, and forming openings in the resin,
- d) etching the protective layer, the thin film, and part of the thickness of the support substrate through the openings in the resin, so as to form pads in the substrate of interest,
- e) bonding a temporary substrate to the substrate of interest,
- f) separating the temporary substrate from the substrate of interest, whereby the protective layer is separated from the substrate of interest and a structured substrate of interest for direct bonding is obtained, in which method either the resin is removed between step d) and step e) and the adhesion energy between the protective layer and the thin film is lower than the adhesion energy between the temporary substrate and the protective layer, or the resin is removed during step f) and the adhesion energy between the protective layer and the thin film is lower than the adhesion energy between the resin and the protective layer.

According to a specific embodiment, step b) is carried out by bonding to the substrate of interest a transfer substrate comprising a support substrate and the protective layer, and then by removing the support substrate.

According to a specific embodiment, the thin film is a hybrid $Cu/SiO_2$ layer comprising a thin silicon oxide film in which copper pads are formed.

According to a specific embodiment, the protective layer is made of $SiO_2$.

According to a specific embodiment, the adhesion energy between the protective layer and the thin film is lower by at least 0.5 $J/m^2$ than the adhesion energy between the temporary substrate and the protective layer, or the adhesion energy between the protective layer and the thin film is lower by at least 0.5 $J/m^2$ than the adhesion energy between the resin and the protective layer.

According to a specific embodiment, the steps of the method are carried out at a temperature lower than or equal to 150° C.

According to a specific embodiment, the method comprises a singulation step during which the substrate of interest is separated into a plurality of portions, at the location of cutting paths positioned between the pads, so as to form chips of interest, the singulation step being preferably carried out by means of a laser irradiation step, of a plasma etching step, or of a saw cutting step.

According to a specific embodiment, the laser irradiation step is carried out, between step d) and step e) or between step e) and step f), the laser irradiation leading to the forming of embrittled areas at the location of the cutting paths, and the substrate of interest is bonded to a stretchable adhesive film, the stretchable adhesive film being stretched, after the laser irradiation step, so as to separate the chips of interest at the location of the embrittled areas.

According to a specific embodiment, the plasma etching step is carried out between steps d) and e), the substrate of interest being bonded to an adhesive film during the plasma etching step and during steps e) and f).

According to a specific embodiment, the plasma etching step is carried out between step e) and step f), the substrate of interest being bonded to an adhesive film during step f).

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which.

DESCRIPTION OF EMBODIMENTS

Figures 1A, 1B, 1C, 1D, 1E, 1F, 2A, 2B, 2C, 2D, 2E, 2F:
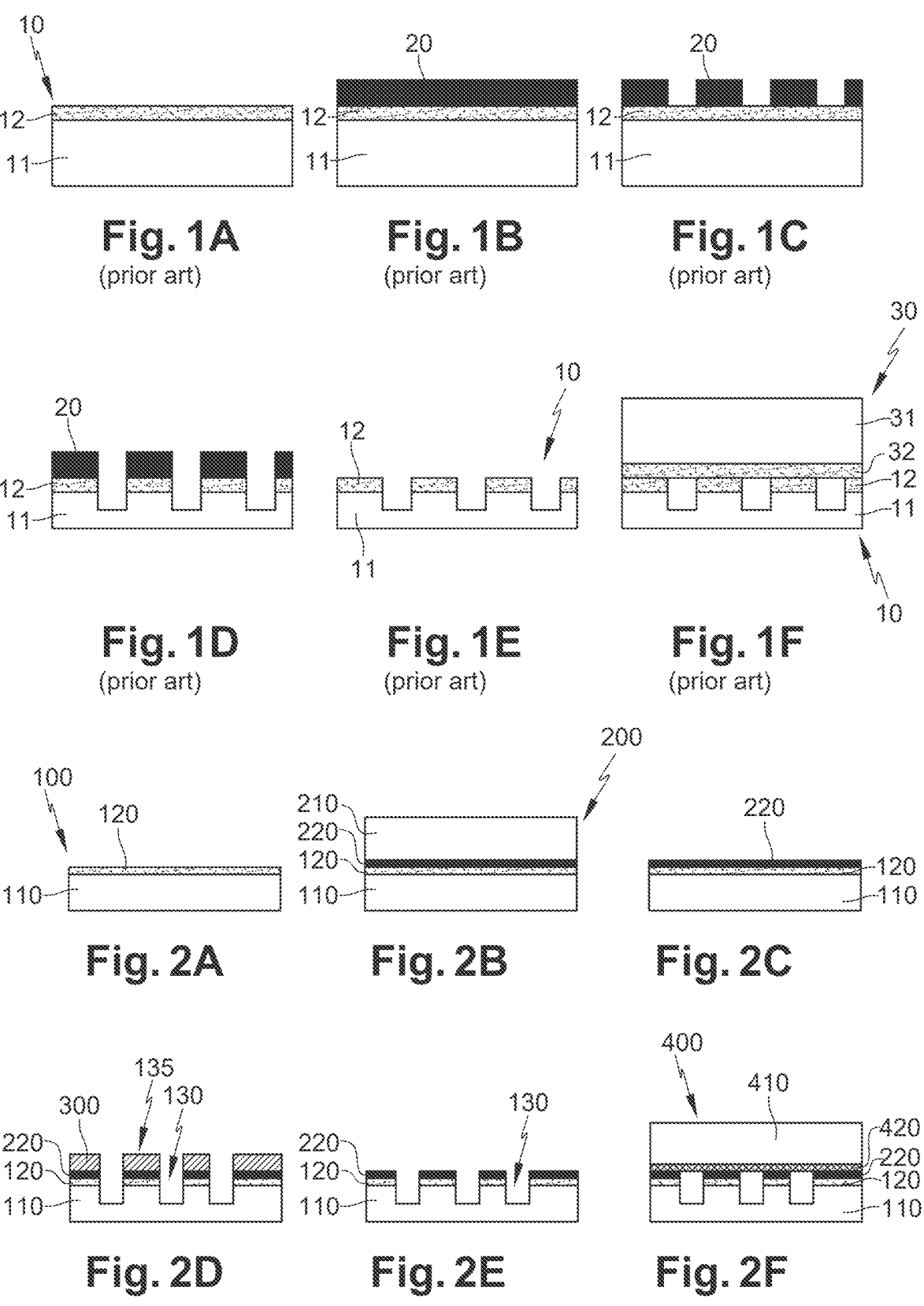
FIG. 1A, FIG. 1B, FIG. 1C, FIG. 1D, FIG. 1E, and FIG. 1F, previously described, schematically show different steps of a method of manufacturing a substrate of interest according to prior art.
FIG. 2A, FIG. 2B, FIG. 2C, FIG. 2D, FIG. 2E, FIG. 2F, and FIG. 2G schematically show different steps of a method of manufacturing a substrate of interest according to a specific embodiment.

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, where reference is made to absolute position qualifiers, such as the terms "front", "back", "top", "bottom", "left", "right", etc., or relative position qualifiers, such as the terms "top", "bottom", "upper", "lower", etc., or orientation qualifiers, such as "horizontal", "vertical", etc., reference is made unless otherwise specified to the orientation of the drawings.

Unless specified otherwise, the expressions "about", "approximately", "substantially", and "in the order of" signify plus or minus 10%, preferably of plus or minus 5%.

Although the disclosure particularly refers to structured substrates with a hybrid $Cu/SiO_2$ bonding surface, the method can be applied to other structured substrates.

All the given bonding energies are determined by the double cantilever beam method (as explained in Fournel et al. 'Measurement of adhesion energy in an anhydrous nitrogen atmosphere and its application to silicon direct bonding technology', Journal of Applied Physics 111, 104907 (2012)).

The method of preparing a structured substrate of interest 100 or chips of interest 150 will now be described in more detail with reference to FIGS. 2A to 2G, 3A to 3F, 4A to 4I, 5A to 5H, and 6A to 6I.

The method comprises at least the following steps:
a) providing a substrate of interest 100 comprising a support substrate 110 and a thin film 120 (FIGS. 2A, 3A, 4A, 5A, 6A),
b) covering thin film 120 with a protective layer 220 (FIGS. 2C, 3C, 4C, 5C, 6C),
c) depositing a resin 300 on protective layer 220, and forming openings in resin 300,
d) etching protective layer 220, thin film 120, and part of the thickness of support substrate 110 through the openings of the resin, so as to form pads 135 in the substrate of interest 100 (FIGS. 2D, 3D, 4D, 5D, 6D),
e) bonding a temporary substrate 400 to the substrate of interest 100 (FIGS. 2F, 3E, 4F, 5F, 6F),
f) separating the temporary substrate 400 from the substrate of interest 100 (FIGS. 2G, 3F, 4G, 5G, 6I).

Figures 4G, 4H, 4I, 5A, 5B, 5C, 5D, 5E, 5F, 5G, 5H:
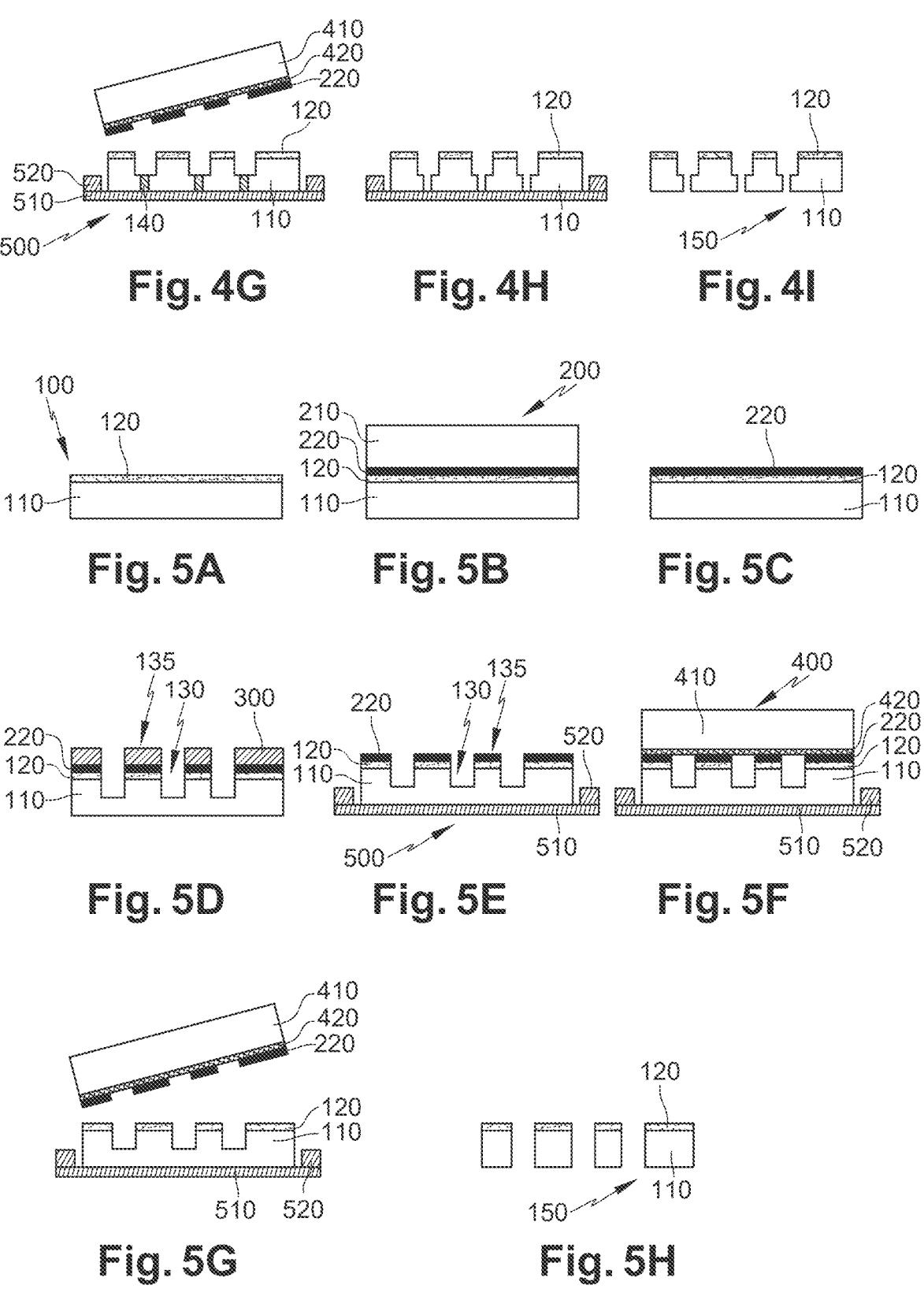
FIG. 5A, FIG. 5B, FIG. 5C, FIG. 5D, FIG. 5E, FIG. 5F, FIG. 5G, and FIG. 5H schematically show different steps of a method of manufacturing a substrate of interest according to another specific embodiment.
Figures 6A, 6B, 6C, 6D, 6E, 6F, 6G, 6H, 6I:
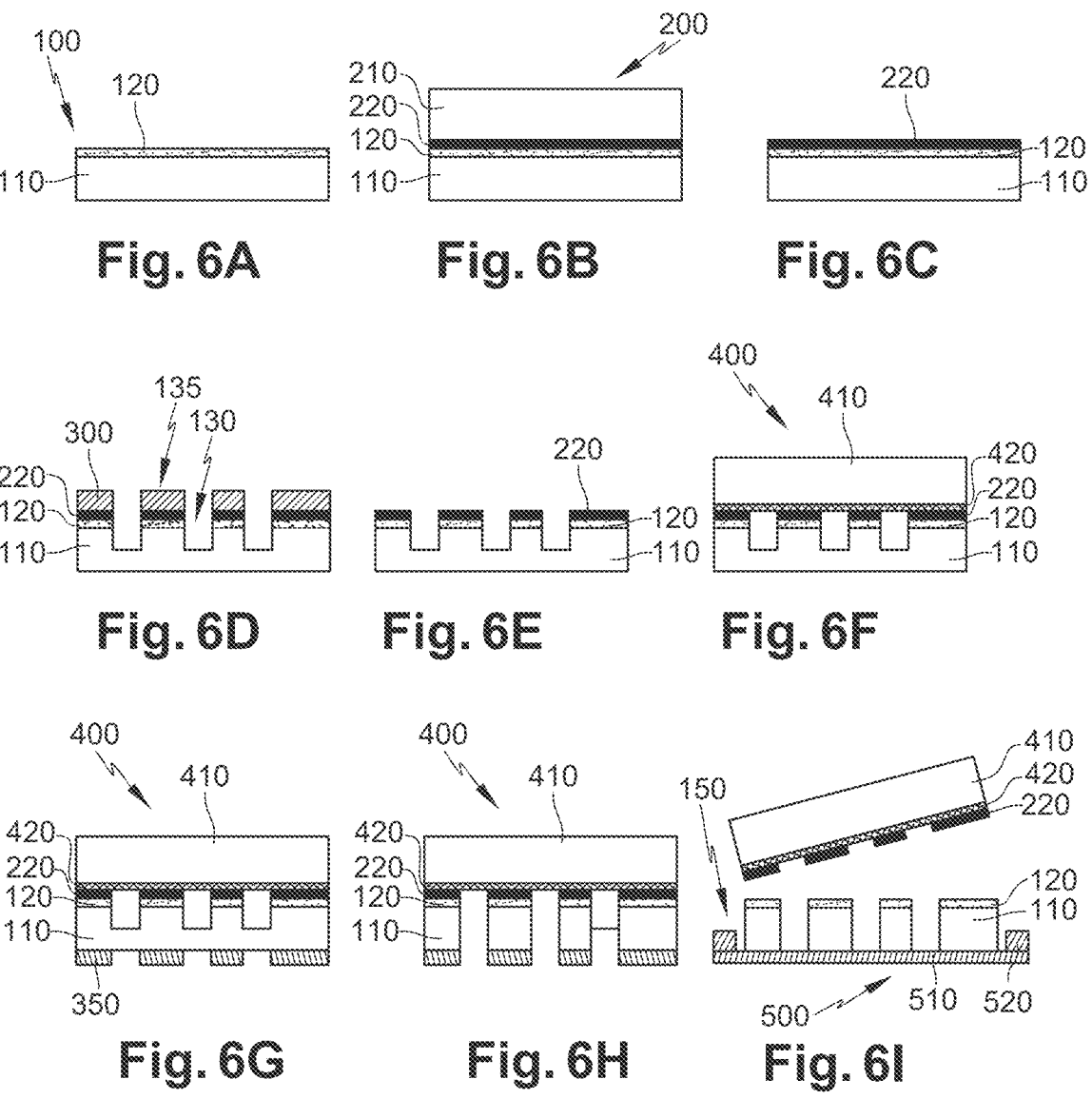
FIG. 6A, FIG. 6B, FIG. 6C, FIG. 6D, FIG. 6E, FIG. 6F, FIG. 6G, FIG. 6H, and FIG. 6I schematically show different steps of a method of manufacturing a substrate of interest according to another specific embodiment.

The method may further comprise an additional step in which the substrate of interest 100 is separated into a plurality of portions to form chips of interest 150 (FIGS. 4H, 5F, 6H). This additional step may be carried out between step c) and step d), between step d) and step e), or after step e).

Protective layer 220 (also called etch stop layer) has a relatively low adhesion Eadh0 (typically lower than 1 $J/m^2$). It is easily detached from the substrate of interest 100 during step f): it is removed at the same time as temporary substrate 400. At the end of step f, a structured substrate of interest 100 capable of being used for direct bonding is obtained.

To guarantee a low adhesion Eadh0, the process temperatures used during the method will preferably be lower than 150° C. and/or the bonding is a low-adhesion direct bonding, such as a bonding involving a hydrophobic silicon surface.

In this method, protective layer 220 is held on the thin film 120 of the substrate of interest 100 by means of a direct bonding process. There is no need to use glue or polymer. The surface of thin film 120 is thus preserved.

The method further comprises a step during which resin 300 is removed.

According to a first embodiment, shown for example in FIGS. 2A to 2G, 4A to 4I, 5A to 5H, and 6A to 6I, resin 300 is removed between step d) and step e) in order to make protective layer 220 accessible. During step e), temporary substrate 400 is bonded to the cleaned surface of protective layer 220.

Resin 300 may be removed by means of plasma oxidation and wet cleaning steps. Protective layer 220 protects thin film 120 during this step.

Temporary substrate 400 may be formed of a solid substrate, or it may be a solid substrate 410 covered with an adhesive layer 420. The use of an adhesive layer 420 enables to be highly tolerant as concerns the surface quality of the stop layer. The bonding adhesion between temporary substrate 400 and protective layer 220 Eadh1 is strong (typically greater than 1.5 $J/m^2$). Energy Eadh1 is greater than energy Eadh0. Thus, during step f), the separation of temporary substrate 400 will lead to the opening of the interface of lowest adhesion: it is the interface between protective layer 220 and the thin film 120 of the substrate of interest 100. The surface of the substrate of interest 100 is cleared and is compatible with a direct bonding method.

According to a second embodiment, shown for example in FIGS. 3A to 3F, resin 300 is removed at step f).

As for the first embodiment, temporary substrate 400 may be a solid substrate or comprise a solid substrate 410 covered with an adhesive layer 420, which makes the bonding very tolerant to the surface condition of resin 300. The adhesion Eadh2 between resin 300 and protective layer 120 is strong (typically greater than 1.5 $J/m^2$). It is greater than Eadh0. The separation of this substrate 400 will lead to the separation of the interface between protective layer 220 and the surface of the substrate of interest 100. The surface of the substrate of interest 100 is cleared and is compatible with a direct bonding process. Protective layer 220 and the resin are removed at the same time as temporary substrate 400.

The substrate of interest 100 provided at step a) is preferably a plate.

The substrate of interest 100 comprises a front side and a back side. The front side corresponds to the surface which is desired to be prepared for direct bonding.

The substrate of interest 100 comprises a support substrate 110 and a thin film 120. Support substrate 110 is, for example, a substrate made of semiconductor material (preferably Si, Ge, SiC, AsGa), sapphire, or silica.

The substrate of interest 100 provided at step a) may be an SOI ('Silicon on Insulator') substrate, that is, comprising a support substrate successively covered with a thin buried oxide film and a silicon layer.

It may also be a solid substrate 110 made of semiconductor material covered with a dielectric layer 120, in particular an oxide layer (silicon oxide in particular).

Thin film 120 is, for example, a metal layer, an oxide layer (in particular, a silicon oxide layer), a layer of a III/V or IV/VI material, a germanium, SiC, silicon, or sapphire layer.

Preferably, thin film 120 is a hybrid layer, formed of at least two materials. Preferably, it is a hybrid $Cu/SiO_2$ layer comprising a silicon oxide matrix in which copper portions (pads) have been formed. The copper pads for example have a 2-μm side length.

The upper surface of thin film 120 corresponds to the surface which is structured and prepared for the direct bonding.

At step b), the thin film 120 of the substrate of interest 100 is covered with a protective layer 220.

Protective layer 220 may be a silicon oxide layer, a silicon layer (also called hydrophobic silicon layer, that is, a layer in which the silicon has Si—H terminations), a nitride layer (such as aluminum nitride), or a polymer layer. It may also be a layer formed of a plurality of materials with, for example, silicon covered with a silicon oxide layer.

According to a preferred embodiment, protective layer 220 is bonded by direct bonding to the substrate of interest 100. This enables to have an intimate contact between protective layer 220 and the thin film 120 of the substrate of interest 100

This embodiment may be carried out according to the following steps:

i) bonding to the substrate of interest 100 a transfer substrate 200 comprising a support 210 and protective layer 220 (FIGS. 2B, 3B, 4B, 5B, 6B), ii) removing support 210 from transfer substrate 200, so as to form an assembly comprising the substrate of interest 100 covered with protective layer 220 (FIGS. 2C, 3C, 4C, 5C, 6C).

At step i), temporary substrate 200 and the substrate of interest 100 are assembled by direct bonding. The direct bonding may be carried out at the atmospheric pressure (that is, 1013.25 hPa) or under vacuum (of the order of one hPa).

Prior to step i), transfer substrate 200 will advantageously be trimmed. The trimming of the edge of plate 200 enables to avoid possible edge problems, especially if step ii) is carried out by thinning.

The trimming may be carried out, for example, by photolithography/etching or also by mechanical trimming by means of a diamond saw. The trimming width is, for example, in the range from 1 to 5 mm and/or its depth is, for example, in the range from 100 to 250 μm.

Step ii) may be carried out by thinning.

Step ii) may be carried out using a laser lift-off technique. For example, support 210 may be formed by a transparent substrate covered with a release layer.

A silicon support 210 may be used with EVGroup's Nanocleave technology for laser lift-off.

The support substrate 210 of temporary substrate 200 may be used in a new bonding/etching cycle. A cleaning is advantageously carried out between each use.

For example, it is possible to recycle it by implementing an oxygen plasma treatment followed by a wet cleaning.

Each time it is used, a new protective layer may, if required, be formed on support substrate 210 before being used again.

During step c), a resin 300 is deposited on protective layer 220. Openings are formed in the resin vertically in line with the cavities 130 of the substrate of interest 100 which is desired to be formed. Resin 300 acts as a mask.

During step d), protective layer 220, thin film 120, and part of the thickness of support substrate 110 are etched.

Pads 135 are thus formed in the substrate of interest 100. Pads 135 are separated by spaces 130.

Pads 135 form, for example, a square step having a 10-mm side length and a 50-μm depth.

During step e), a temporary substrate 400 is bonded to the substrate of interest 100.

If resin 300 has been removed between step d) and step e), temporary substrate 400 is bonded to protective layer 220.

If resin 300 has not been removed, temporary substrate 400 is bonded to resin layer 300.

Temporary substrate 400 comprises a support substrate 410 and a layer 420, preferably an adhesive layer.

During step f), temporary substrate 400 is removed. Protective layer 220 and, if applicable, resin 300 are simultaneously removed. This step is made possible by the differences in adhesion energy involved.

To favor the removal of protective layer 120, it is possible to perform a gaseous species implantation prior to the bonding of step e). The implantation may be carried out through protective layer 120 and, potentially, also through resin layer 300.

At the end of this implantation step, a thermal anneal may be carried out to diffuse the gaseous species and promote the separation at the interface between the layer of interest 120 and protective layer 220.

Figures 2G, 3A, 3B, 3C, 3D, 3E, 3F, 4A, 4B, 4C, 4D, 4E, 4F:
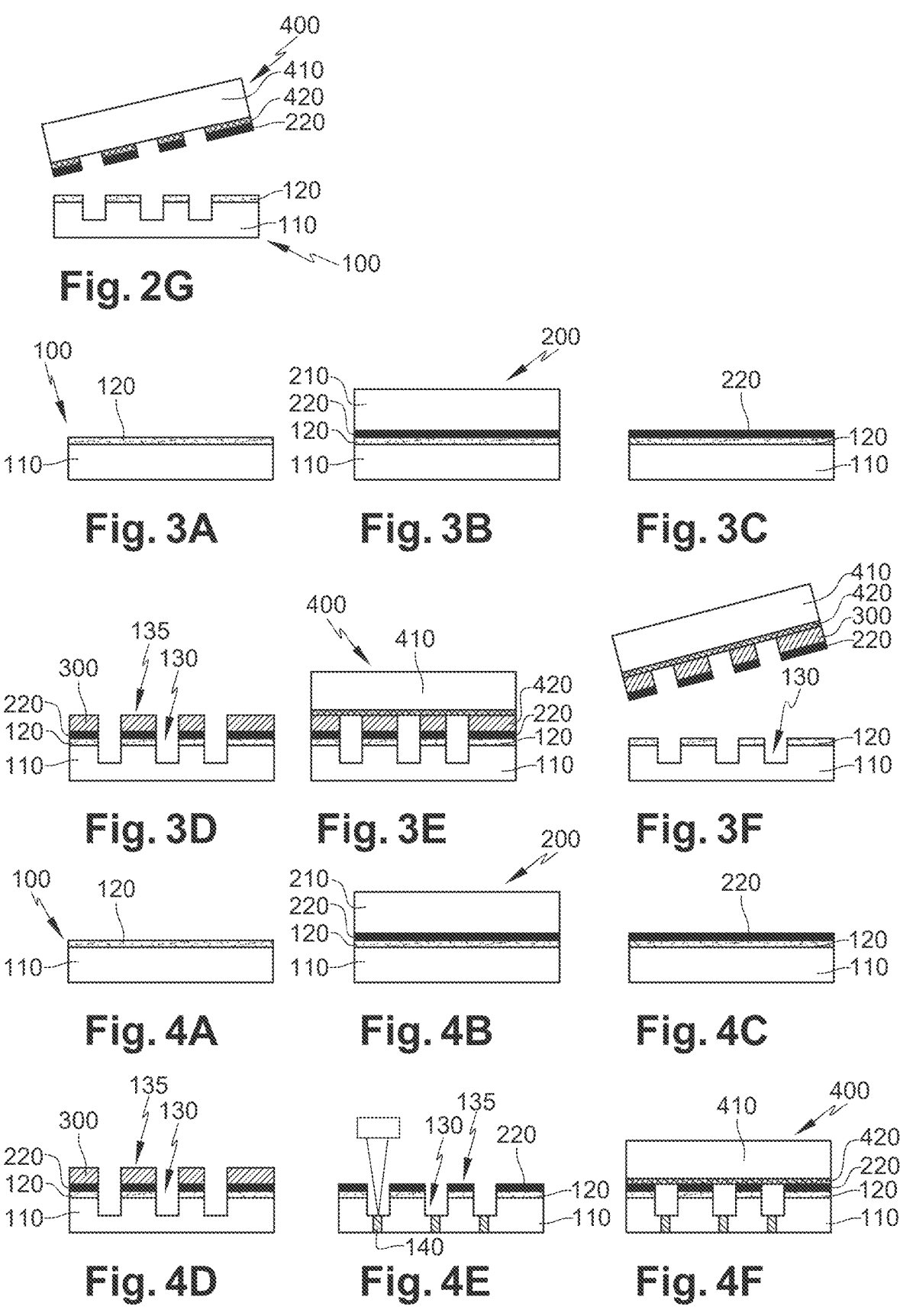
FIG. 3A, FIG. 3B, FIG. 3C, FIG. 3D, FIG. 3E, and FIG. 3F schematically show different steps of a method of manufacturing a substrate of interest according to another specific embodiment.
FIG. 4A, FIG. 4B, FIG. 4C, FIG. 4D, FIG. 4E, FIG. 4F, FIG. 4G, FIG. 4H, and FIG. 4I schematically show different steps of a method of manufacturing a substrate of interest according to another specific embodiment.

At the end of step f), structured substrates of interest 100 are obtained (FIGS. 2G and 3F). Their surfaces are ready for a direct bonding.

It is also possible to carry out an additional step during which the substrate of interest 100 is cut or etched, at location of the spaces 130 between pads 135, to obtain chips of interest 150 having their surface ready for a direct bonding (as shown in FIGS. 4I, 5H, and 6I).

The cutting or etching is performed across the entire thickness of substrate 110.

This step may be carried out before step e) or after step f).

It may be performed by means of different techniques.

According to a first alternative embodiment, shown in FIGS. 4E to 4I, the cutting is performed by means of a laser ('Stealth Dicing' cutting).

In a first step, a laser irradiation is performed between pads 135 to form embrittled areas 140. This step may be carried out, prior to step e), either by irradiating from the front side of the substrate of interest 100 or by irradiating from the back side. Alternatively, this laser irradiation step may be carried out after step e), by irradiating the back side of the substrate of interest. For a backside irradiation (before or after bonding of the substrates), alignment marks or an alignment by infrared vision may be implemented.

After having carried out the irradiation step (FIG. 4E) and the step of bonding (FIG. 4F) of the substrate of interest 100 to temporary substrate 400 (or conversely), the substrate of interest 100 is bonded to a device 500 comprising an adhesive film 510 held in place by a metal frame 520. Temporary substrate 400 is then detached to remove protective layer 220 from the front side of the substrate of interest (FIG. 4G). Then, stretchable adhesive film 510 is stretched (FIG. 4H) to cause the fracture of the substrate of interest 100 in the areas embrittled 140 by irradiation. The chips of interest 150 are thus obtained. Chips 150 are then removed from stretchable film 510.

According to a second alternative embodiment, as shown in FIGS. 5E to 5H and 6G to 6I, the cutting of substrate 100 is performed by means of a plasma. It is a so-called deep cutting.

For example, the deep cutting of substrate 100, particularly made of silicon, may be carried out with a Bosch process.

According to a first embodiment, as shown in FIGS. 5E and 5F, the etching may be performed from the front side of the substrate of interest 100 just prior to step e).

To singulate chips 150, the substrate of interest 100 is bonded to a device 500 comprising an adhesive film 510 held in place by a metal frame 520 (FIG. 5E). Then, the etch step is carried out. Protective layer 220 may play the role of a hard mask during the etching, which enables to decrease the process time.

Temporary substrate 400 is then bonded (FIG. 5F). Upon separation of temporary substrate 400, the chips of interest 150 bonded to adhesive film 510 are obtained (FIG. 5G). After separation of adhesive film 510, the chips are ready for use (FIG. 5H).

According to a second embodiment, as shown in FIGS. 6F to 6I, the deep etching of the substrate of interest 100 may be carried out after step e), from the back side of the substrate of interest 100. A hard mask will first be deposited on the back side of the substrate of interest 100 (FIG. 6G), before or after bonding to temporary substrate 400.

At the end of the etch step, chips 150 are held in place due to the bonding to temporary substrate 400 (FIG. 6H). There is no need to use an adhesive during this step, which requires less complex equipment and simplifies the method.

Once the etching has been performed, the hard mask is removed. Then, the back side of the substrate of interest 100 is bonded to a device 500 comprising an adhesive film 510 held by a metal frame 520, after which temporary substrate 400 is detached to obtain the chips of interest (FIG. 6I).

It is possible to mix the two latter variants by performing a first deep etching on the front side of support substrate 110, by astutely using layer 220 as a hard mask. Since it is a partial etching, there is no need for adhesive film 510. Then, the bonding to temporary substrate 400 is performed, and a thinning of the back side of support substrate 110 may be carried out by the same deep etching technique by having placed a hard mask, or an etching over the entire surface may be carried out. This last option amounts to thinning the chips until emerging onto the first partial deep etch. Then, support substrate 110 is bonded to adhesive film 510 and temporary substrate 400 is detached.

According to a third alternative embodiment, not shown, the cutting is carried out mechanically, particularly by means of a saw.

The substrate of interest 100 may be cut before or after the bonding with temporary substrate 400.

When substrate 100 is cut prior to bonding to temporary substrate 400, it is previously bonded to a device 500 comprising an adhesive film held in place by a frame, and then sawn to obtain the chips of interest 150. Chips 150 are then bonded to the temporary substrate, after which the latter is detached to remove protective layer 220 and obtain the chips of interest 150.

When substrate 100 is cut after bonding to temporary substrate 400, it will be ascertained not to cut temporary substrate 400 or a very small thickness of temporary substrate 400, so as not to embrittle it and maintain a functional separation. This alternative embodiment is particularly advantageous since not only does it enable to perform a cutting without using an adhesive film, but also will the future front side of the chips of interest 150 be completely undisturbed by the possible particulate contamination from the cutting, since the protective bonding is in place. After the cutting, the back side of the substrate of interest 100 is positioned on an adhesive film held in place by a frame, and temporary substrate 400 is detached. The chips of interest 150 are obtained.

It is also possible to cut the substrate by implementing a cleavage. The cleavage may be initiated by making a notch in the substrate, for example, by means of a diamond tip.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

ILLUSTRATIVE AND NON-LIMITING
EXAMPLES OF DIFFERENT EMBODIMENTS

Example 1

On a silicon wafer of interest, copper pads with a 2-$\mu$m side length are formed by a Damascene process in a $SiO_2$ matrix. This wafer undergoes a chemical-mechanical polishing process to make it compatible with a direct bonding process. An SOI-type transfer substrate is used. It comprises a 205-nm silicon film on a 400-nm oxide layer. It is trimmed with a diamond saw down to a 250-$\mu$m depth and a 1.5-mm width. A cleaning of the surface of the transfer substrate is carried out to make it compatible with a hydrophilic direct bonding process.

The substrate of interest and the transfer substrate are assembled by direct bonding.

The transfer substrate is thinned down to 50 μm, after which the remaining silicon is removed by a SF$_6$-based plasma etching. The etching stops on the 400-nm oxide layer. The silicon may also be etched by means of an aqueous HF/HNO$_3$ solution. The SiO$_2$ layer is finally removed by an HF-based wet etching.

A photolithography/etch step is carried out on this structure to obtain pads with a 50-μm thickness and a 10-mm side length.

This structure is bonded to a temporary substrate 400 covered with an adhesive film. For example, it is an adhesive film marketed by Furukawa under reference SP5207M-425. It comprises a 5-μm adhesive layer.

The back side of the substrate of interest is placed on a vacuum table. By inserting a wedge into the bond, the assembly is disassembled. The opening separates the interface between the substrate of interest and the silicon film of the temporary substrate. A surface of copper pads having a 2-μm side length is obtained on a square step having a 10-mm side length and a 50-μm depth, directly compatible with a direct bonding process.

Example 2

On a silicon wafer of interest, copper pads with a 2-μm side length are formed by a Damascene process in a SiO$_2$ matrix. This wafer undergoes a chemical-mechanical polishing process to make it compatible with a direct bonding process. An SOI-type transfer substrate comprises a 205-nm silicon film on a 400-nm oxide layer. This substrate is trimmed by a diamond saw down to a 250-μm depth and a 1.5-mm width. A cleaning of the surface of the transfer substrate is performed by means of an HF-based deoxidizing treatment to prepare a hydrophobic direct bonding.

The substrate of interest and the transfer substrate are assembled by direct bonding.

The transfer substrate is thinned down to 50 μm and the remaining silicon is removed by a SF$_6$-based plasma etching, which stops at the 400-nm oxide layer. The silicon may also be etched by means of an aqueous HF/HNO$_3$ solution. The SiO$_2$ layer is finally removed by an HF-based wet etching.

A photolithography/etching step is carried out on this structure to obtain 50 μm-thick pads having a 10-mm side length.

This structure is bonded to a temporary substrate comprising an adhesive such as an adhesive film marketed by Furukawa under the reference SP5207M-425. The adhesive film has a 5-μm thickness. The back side of the substrate of interest is then placed on a vacuum table. By inserting a wedge into the bond, the assembly is disassembled. The opening separates the interface between the substrate of interest and the silicon film. A surface of copper pads having a 2-μm square is obtained on a square having with a 10-mm side length and a 50-μm depth, directly compatible with a direct bonding process.

Example 3

On a silicon wafer of interest, copper pads with a 2-μm side length are formed by a Damascene process in a SiO$_2$ matrix. This wafer undergoes a chemical-mechanical polishing process to make it compatible with a direct bonding process. On a temporary silicon substrate, 1 μm of SiO$_2$ is deposited by chemical vapor deposition. This wafer is then trimmed with a diamond saw down to a 250-μm depth and a 1.5-mm width. A cleaning of the surface of the transfer substrate followed by a chemical-mechanical polishing are carried out.

The substrate of interest and the transfer substrate are assembled by direct bonding. S1t is thinned down to 50 μm and then the remaining silicon is removed by SF$_6$ plasma etching, which stops on the 1-μm oxide layer.

A photolithography/etch step is performed on this structure so as to obtain 50 μm-thick pads having a 10-mm side length.

This structure is bonded to a temporary substrate comprising a glass plate on which 10 μm of adhesive (LC5200) have been spread. The bonding is carried out at room temperature by UV exposure. The back of the substrate of interest is then placed on a vacuum table. By inserting a wedge into the bond, the assembly is disassembled. The opening separates the interface between the substrate of interest and the oxide film of the transfer substrate. The result is a surface of copper pads having a 2-μm side length on a square step having a 10-mm side length and a 50-μm depth, directly compatible with a direct bonding process.

Example 4

On a silicon wafer of interest, copper pads with a 2-μm side length are formed by a Damascene process in a SiO$_2$ matrix. This wafer undergoes a chemical-mechanical polishing process to make it compatible with a direct bonding process. On a silicon transfer substrate, 1 μm of SiO$_2$ is deposited by chemical vapor deposition. This plate is then trimmed with a diamond saw down to a 250-μm depth and a 1.5-mm width. A cleaning of the surface of the transfer substrate followed by a chemical-mechanical polishing are carried out.

The substrate of interest and the temporary substrate are assembled by direct bonding. The transfer substrate is thinned down to 50 μm and then the remaining silicon is removed by a SF$_6$ plasma etching, which stops on the 1-μm oxide layer.

By means of a resin marketed under trade name TOK TDMR having a 1-μm thickness, a photolithography/etch step is performed on the structure so as to obtain pads having a 50-μm thickness and a 10-mm side length. After etching, the resin is not removed by means of conventional plasma etching techniques combined with a wet cleaning.

This structure is bonded to a temporary substrate comprising a glass plate on which 10 μm of adhesive (LC5200) have been spread. The bonding is carried out at room temperature by UV illumination. The structure is placed on a vacuum table: the back side of the substrate of interest is sucked in. By inserting a wedge into the bond, the assembly is disassembled. The opening separates the interface between the substrate of interest and the oxide film originating from the transfer substrate. A surface of copper pads with a 2-μm side length is obtained on a square step having a 10-mm side length and a 50-μm depth, directly compatible with a direct bonding process.

The invention claimed is:

1. Method of preparing a structured substrate of interest for direct bonding comprising the following steps:
    a) providing a substrate of interest comprising a support substrate and a thin film,
    b) bonding a protective layer to the thin film by direct bonding,
    c) depositing a resin on the protective layer, and forming openings in the resin, d) etching the protective layer, the thin film, and part of the thickness of the support substrate through the openings in the resin, so as to form pads in the substrate of interest, e) bonding a temporary substrate and the substrate of interest, f) separating the temporary substrate from the substrate of interest, whereby the protective layer is separated from the substrate of interest and a structured substrate of interest is obtained for direct bonding, in which the resin is removed between step d) and step e) and the adhesion energy between the protective layer and the thin film is lower than the adhesion energy between the temporary substrate and the protective layer.

2. Method according to claim 1, wherein step b) is carried out by bonding to the substrate of interest a transfer substrate comprising a support substrate and the protective layer, and then by removing the support substrate.

3. Method according to claim 1, wherein the thin film is a hybrid $Cu/SiO_2$ layer comprising a thin silicon oxide film in which copper pads are formed.

4. Method according to claim 1, wherein the protective layer is made of $SiO_2$.

5. Method according to claim 1, wherein the adhesion energy between the protective layer and the thin film is lower by at least 0.5 $J/m^2$ less than the adhesion energy between the temporary substrate and the protective layer.

6. Method according to claim 1, wherein the steps of the method are carried out at a temperature lower than or equal to 150° C.

7. Method according to claim 1, wherein the method comprises a singulation step during which the substrate of interest is separated into a plurality of portions, at the location of cutting paths positioned between the pads so as to form chips of interest, the singulation step being preferably carried out by means of a saw cutting step, a laser irradiation step, or a plasma etching step.

8. Method according to claim 7, wherein the laser irradiation step is carried out between step d) and step e) or between step e) and step f), the laser irradiation leading to the forming of embrittled areas at the location of the cutting paths, and wherein the substrate of interest is bonded to a stretchable adhesive film, the stretchable adhesive film being stretched, after the laser irradiation step, so as to separate the chips of interest at the location of the embrittled areas.

9. Method according to claim 7, wherein the plasma etching step is carried out between step d) and step e), the substrate of interest being bonded to an adhesive film during the plasma etching step and during steps e) and f).

10. Method according to claim 7, wherein the plasma etching step is carried out between step e) and step f), the substrate of interest being bonded to an adhesive film during step f).

* * * * *